United States Patent
Kim et al.

(10) Patent No.: US 9,583,219 B2
(45) Date of Patent: Feb. 28, 2017

(54) METHOD AND APPARATUS FOR IN-SYSTEM REPAIR OF MEMORY IN BURST REFRESH

(71) Applicant: QUALCOMM Incorporated, San Diego, CA (US)

(72) Inventors: Jung Pill Kim, San Diego, CA (US); Dexter Tamio Chun, San Diego, CA (US); Deepti Vijayalakshmi Sriramagiri, San Diego, CA (US); Jungwon Suh, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 77 days.

(21) Appl. No.: 14/499,161

(22) Filed: Sep. 27, 2014

(65) Prior Publication Data

US 2016/0093403 A1    Mar. 31, 2016

(51) Int. Cl.
  *G11C 29/00* (2006.01)
  *G06F 11/07* (2006.01)
  *G11C 11/406* (2006.01)
  *G11C 17/16* (2006.01)
  (Continued)

(52) U.S. Cl.
  CPC ............ *G11C 29/78* (2013.01); *G06F 11/073* (2013.01); *G06F 11/0751* (2013.01); *G06F 11/0793* (2013.01); *G11C 11/406* (2013.01); *G11C 11/40603* (2013.01); *G11C 11/40615* (2013.01); *G11C 17/16* (2013.01); *G11C 17/18* (2013.01);
  (Continued)

(58) Field of Classification Search
  CPC ...... G11C 29/78; G11C 29/783; G11C 29/787; G11C 29/027; G11C 17/16; G11C 17/18; G11C 11/40615; G06F 11/073; G06F 11/0751; G06F 11/0793
  USPC .......... 365/96, 149, 200, 222, 225.7, 233.13
  See application file for complete search history.

(56) References Cited

U.S. PATENT DOCUMENTS

| | | | | |
|---|---|---|---|---|
| 4,412,314 A | * | 10/1983 | Proebsting | .......... G06F 11/1008 365/195 |
| 4,937,465 A | * | 6/1990 | Johnson | ................. G11C 17/18 327/525 |
| 5,828,258 A | | 10/1998 | Ooishi et al. | |

(Continued)

FOREIGN PATENT DOCUMENTS

| CN | 1357892 A | 7/2002 |
|---|---|---|
| CN | 1655280 A | 8/2005 |

(Continued)

OTHER PUBLICATIONS

International Search Report and Written Opinion—PCT/US2015/050466—ISA/EPO—Mar. 17, 2016.

(Continued)

*Primary Examiner* — Vu Le
*Assistant Examiner* — Sung Cho
(74) *Attorney, Agent, or Firm* — Muncy, Geissler, Olds & Lowe, P.C.

(57) ABSTRACT

In a repair of a random access memory (RAM), an error information is received, a fail address of the RAM identified, and a one-time programming applied to a portion of the redundancy circuit while a content of the RAM is valid. Optionally, the RAM is a dynamic access RAM (DRAM), a refresh burst is applied to the DRAM, followed by a non-refresh interval, and the one-time programming is performed during the non-refresh interval.

30 Claims, 5 Drawing Sheets

(51) Int. Cl.
*G11C 17/18* (2006.01)
*G11C 29/02* (2006.01)

(52) U.S. Cl.
CPC .......... *G11C 29/783* (2013.01); *G11C 29/787* (2013.01); *G11C 29/027* (2013.01)

(56) References Cited

U.S. PATENT DOCUMENTS

| | | | |
|---|---|---|---|
| 5,956,350 A | 9/1999 | Irrinki et al. | |
| 6,130,442 A | 10/2000 | Di Zenzo et al. | |
| 6,316,963 B1 | 11/2001 | Yanagisawa | |
| 6,553,556 B1 | 4/2003 | Blodgett | |
| 6,853,602 B2 | 2/2005 | Huang | |
| 7,254,069 B2 * | 8/2007 | Haraguchi | G11C 29/80 365/200 |
| 7,318,183 B2 * | 1/2008 | Ito | G06F 11/1008 714/754 |
| 7,379,369 B2 * | 5/2008 | Lee | G11C 11/406 365/222 |
| 7,392,456 B2 | 6/2008 | Leung et al. | |
| 7,477,563 B2 * | 1/2009 | Kang | G11C 11/406 365/185.09 |
| 7,523,380 B1 | 4/2009 | Trimberger | |
| 7,570,536 B2 * | 8/2009 | Chi | G11C 29/783 365/194 |
| 8,621,324 B2 | 12/2013 | Suh | |
| 2002/0004921 A1 | 1/2002 | Muranaka et al. | |
| 2002/0122341 A1 * | 9/2002 | Perner | G11C 29/78 365/200 |
| 2003/0135794 A1 | 7/2003 | Longwell et al. | |
| 2004/0066695 A1 | 4/2004 | Anand et al. | |
| 2004/0205426 A1 | 10/2004 | Muranaka et al. | |
| 2005/0169083 A1 | 8/2005 | Riho et al. | |
| 2005/0243617 A1 * | 11/2005 | Kang | G11C 29/808 365/200 |
| 2005/0281112 A1 * | 12/2005 | Ito | G11C 11/406 365/222 |
| 2006/0156192 A1 | 7/2006 | Nakamura et al. | |
| 2007/0011596 A1 * | 1/2007 | Suh | G06F 11/106 714/800 |
| 2007/0022244 A1 | 1/2007 | Kimmery | |
| 2007/0076504 A1 * | 4/2007 | Suh | G11C 11/406 365/222 |
| 2007/0079212 A1 | 4/2007 | Har-Chen et al. | |
| 2007/0079218 A1 * | 4/2007 | Nagai | G06F 11/106 714/763 |
| 2007/0133315 A1 | 6/2007 | Kang et al. | |
| 2007/0230265 A1 | 10/2007 | Riho et al. | |
| 2007/0268760 A1 | 11/2007 | Iwai | |
| 2007/0277065 A1 | 11/2007 | Sato | |
| 2008/0031068 A1 * | 2/2008 | Yoo | G11C 11/406 365/222 |
| 2008/0092016 A1 | 4/2008 | Pawlowski | |
| 2008/0195894 A1 * | 8/2008 | Schreck | G06F 11/1056 714/34 |
| 2008/0222483 A1 | 9/2008 | Ito et al. | |
| 2009/0016129 A1 | 1/2009 | Anand et al. | |
| 2009/0168571 A1 * | 7/2009 | Pyo | G11C 11/406 365/200 |
| 2009/0193301 A1 | 7/2009 | Ito et al. | |
| 2009/0204752 A1 * | 8/2009 | Sasaki | G06F 11/106 711/105 |
| 2009/0249169 A1 | 10/2009 | Bains et al. | |
| 2010/0046307 A1 * | 2/2010 | Kobayashi | G11C 7/02 365/189.09 |
| 2010/0054070 A1 | 3/2010 | Klein | |
| 2010/0106901 A1 | 4/2010 | Higeta et al. | |
| 2010/0157703 A1 | 6/2010 | Fischer et al. | |
| 2010/0313084 A1 * | 12/2010 | Hida | G06F 11/1068 714/704 |
| 2012/0036411 A1 * | 2/2012 | Ito | G06F 11/106 714/754 |
| 2012/0151299 A1 * | 6/2012 | Suh | G11C 11/40615 714/764 |
| 2012/0221905 A1 | 8/2012 | Burger et al. | |
| 2012/0246544 A1 | 9/2012 | Resnick et al. | |
| 2012/0294058 A1 * | 11/2012 | Best | G11C 5/02 365/51 |
| 2013/0016574 A1 * | 1/2013 | Kim | G11C 11/40622 365/189.07 |
| 2013/0322160 A1 * | 12/2013 | Kim | G11C 29/04 365/154 |
| 2013/0326267 A1 | 12/2013 | Moon et al. | |
| 2014/0269134 A1 * | 9/2014 | Kim | G11C 11/408 365/222 |

FOREIGN PATENT DOCUMENTS

| | | |
|---|---|---|
| CN | 101794622 A | 8/2010 |
| DE | 10353782 A1 | 6/2004 |
| JP | S54154228 A | 12/1979 |
| JP | S5698780 A | 8/1981 |
| JP | S5698781 A | 8/1981 |
| JP | S63308795 A | 12/1988 |
| JP | H01239656 A | 9/1989 |
| JP | H03134900 A | 6/1991 |
| JP | 2002025299 A | 1/2002 |
| JP | 2006004557 A | 1/2006 |
| JP | 2007035035 A | 2/2007 |
| JP | 2009050103 A | 3/2009 |
| JP | 2010067098 A | 3/2010 |
| KR | 20090050103 A | 5/2009 |
| KR | 20100117134 A | 11/2010 |

OTHER PUBLICATIONS

Partial International Search Report—PCT/US2015/050466—ISA/EPO—Nov. 19, 2015.

\* cited by examiner

METHOD AND APPARATUS FOR IN-SYSTEM REPAIR OF MEMORY IN BURST REFRESH

FIELD OF DISCLOSURE

The present application is generally related to semi-conductor memory and, more particularly, to repair of semi-conductor memory failure.

BACKGROUND

One conventional technique that can provide for repair of failed addresses in dynamic random access memories (DRAMs) is to include redundant memory cells that are selectively activated by blowing fuses or anti-fuses. The blowing of the fuses or anti-fuses addresses can be termed "one-time programming" or "OTP." However, when applied to conventional DRAMs, known, conventional OTP techniques can result in loss of the DRAM data content. A reason for the loss of data content is that DRAMs must be periodically refreshed (read and re-written) to maintain validity of data content. If the refresh is interrupted for a period exceeding a given maximum duration, validity of data content may be lost. Known, conventional OTP techniques can require programming times that may be significantly longer than the given maximum duration a DRAM can go without refresh. Offloading the data content of the DRAM to another memory prior to performing OTP, performing OTP on the DRAM, and then re-loading the DRAM can be a useable measure for some applications. However, this measure can impose significant costs, including, for example, processing overhead for the offload and re-load, and an added requirement for substantial excess memory capacity.

SUMMARY

This Summary identifies features and aspects of some example aspects, and is not an exclusive or exhaustive description of the disclosed subject matter. Whether features or aspects are included in, or omitted from this Summary is not intended as indicative of relative importance of such features. Additional features and aspects are described, and will become apparent to persons skilled in the art upon reading the following detailed description and viewing the drawings that form a part thereof.

Various systems and methods that can provide, among other features and benefits, repair of failed address ranges in a RAM, with further features including, but not limited to, maintain a content of the RAM in a valid state are disclosed.

Example methods according to an aspect can provide repair of a random access memory (RAM) having a redundancy circuit, and can include receiving an error information, that may identify a fail address of the RAM and, in response to the error information, may apply a one-time programming to the redundancy circuit and, while applying the one-time programming to the redundancy circuit, can maintain a content of the RAM in a valid state.

In an aspect, disclosed methods can include the RAM being dynamic access RAM (DRAM), and such methods can include, for example, iterative one-time programming, in a cooperative relation with refresh operations, to provide repair while maintaining the content of the DRAM in the valid state.

In an aspect, disclosed apparatuses can provide repair of a RAM having a programmable redundancy circuit, and may include means for receiving an error information that may identify a fail address of the RAM, and may include means for applying a one-time programming to the redundancy circuit in response to the error information, and, while applying the one-time programming to the redundancy circuit, maintaining a content of the RAM in a valid state.

In another aspect, disclosed apparatuses can provide repair of a RAM having a programmable redundancy circuit, and may include a module for detecting a fail address in the RAM and generating, as a result, an error information that may identify the fail address. Disclosed apparatuses may further comprise a module for maintaining a content of the RAM in a valid state, and a module for applying a one-time programming to the redundancy circuit in response to the error information, while the module for maintaining the content of the RAM in the valid state maintains the content of the RAM in the valid state.

In an aspect, disclosed non-transitory computer-readable media may comprise code that when executed by a processor can cause the processor to perform operations for repairing a memory device having a redundancy circuit, while maintaining a valid content in the memory device. In a further aspect, disclosed non-transitory computer-readable media may include code that when executed may cause the processor to receive an error information that may identify a fail address of the RAM, and to applying a one-time programming to the redundancy circuit in response to the error information, and, while applying the one-time programming to the redundancy circuit, maintain a content of the RAM in a valid state.

BRIEF DESCRIPTION OF THE DRAWINGS

The accompanying drawings are presented to aid in the description of aspects of the invention and are provided solely for illustration not limitation thereof.

DETAILED DESCRIPTION

Figure 1:
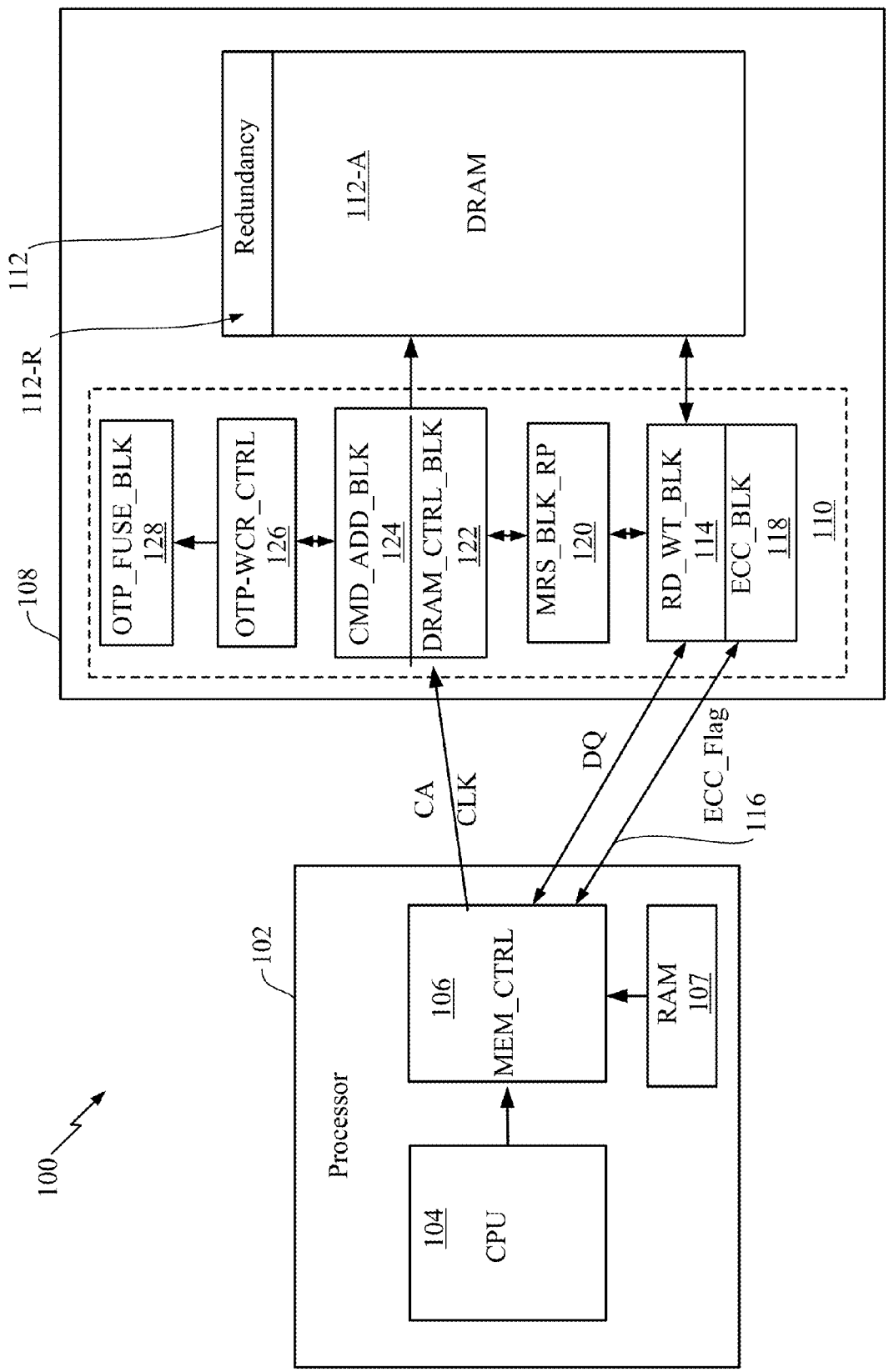
FIG. 1 shows a functional block schematic of one example processor system with in-system error managed memory, configured in accordance with one or more aspects.

Aspects of the invention are disclosed in the following description and related drawings directed to specific exemplary aspects. Alternate aspects may be devised without departing from the scope of the invention. In certain described example implementations, instances are identified where various component structures and portions of operations can be taken from known, conventional techniques, and then arranged in accordance with one or more aspects. In such instances, internal details of the known, conventional component structures and/or portions of operations are omitted to help avoid potential obfuscation of inventive concepts.

The terminology used herein is only for the purpose of describing particular aspects and is not intended to limit the scope of the invention.

The word "exemplary," as used herein, means "serving as an example, instance, or illustration." Accordingly, the term "exemplary aspect," as used herein, means an aspect serving as an example, instance, or illustration, but that is not necessarily preferred or advantageous over other aspects. Likewise, it will be understood that the term "aspects of the invention," as used herein in reference to a feature, advantage or mode of operation, does not mean that all aspects of the invention include the discussed feature, advantage or mode of operation.

As used herein, the singular forms "a", "an" and "the" are intended to include the plural forms as well, unless the context clearly indicates otherwise. The terms "comprises", "comprising," "includes" and/or "including", when used herein, specify the presence of stated features, integers, steps, operations, elements, and/or components, but do not preclude the presence or addition of one or more other features, integers, steps, operations, elements, components, and/or groups thereof.

Certain aspects are described in terms of operations and steps, for example, in or relating to various processes of design and fabrication. It will be understood that except in instances where explicitly stated otherwise, or where made clear from a particular context, that the described order of such operations and steps is only for purposes of example, and is not necessarily limiting of the order of operations or steps that may be applied in practices according to various exemplary aspects.

In addition, operations in various processes are described in reference to flow diagrams. It will be understood that the flow diagrams do not necessarily mean that operations shown by one block terminate, or cannot continue upon commencement of operations shown by another block.

Certain aspects are described in terms of example operations, steps, actions and sequences of operations, steps and actions that can performed by or under control of, for example, a computing device or elements of a computing device. It will be understood by persons of ordinary skill, upon reading this disclosure, that such operations, steps, actions, sequences and other combinations thereof can be performed by, or under control of specific circuits (e.g., application specific integrated circuits (ASICs)), by program instructions being executed by one or more processors, or by a combination of both.

Accordingly, it will be appreciated by such persons that operations, steps, actions, sequences and other combinations thereof can be embodied entirely within any form of computer readable storage medium having stored therein a corresponding set of computer instructions that, upon execution, can cause an associated processor to perform, directly or indirectly, operations, steps, actions, sequences and other combinations described herein. Thus, the various aspects of the invention may be embodied in a number of different forms, all of which are contemplated to be within the scope of the claimed subject matter.

FIG. 1 shows a functional block schematic of one processor system 100 configured in accordance with one or more exemplary aspects. The processor system may comprise a processor 102 having, for example, a CPU 104 and a memory controller 106 and, external to processor 102, a DRAM device 108. In an aspect, the processor 102 may be implemented as a system-on-chip (SOC) processor device. Referring to FIG. 1, the DRAM device 108 may include a local control logic, such as DRAM local control logic 110. The DRAM local control logic 110 may provide, or include functional or logical blocks such as the examples labeled and visible in FIG. 1, which are described in further detail later in this disclosure.

Referring to FIG. 1, the DRAM device 108 may include, for example, a DRAM cell array 112. The DRAM cell array 112 may include a cell array structured and arranged in accordance conventional row-column addressable cell array (not separately visible in FIG. 1) techniques. In accordance with known, conventional row-column addressable cell array techniques, the DRAM cell array 112 may include, for example, known, conventional DRAM word line and bit line decoders (not separately visible in FIG. 1), conventional DRAM read circuitry, e.g., sense amplifiers (not explicitly visible in FIG. 1), and conventional DRAM write circuitry (not explicitly visible in FIG. 1).

In an aspect, the DRAM cell array 112 may comprise a nominal active DRAM area 112-A and a resource of redundant DRAM cells labeled "Redundancy"112-R. The Redundancy 112-R may be structured and arranged according to known, conventional DRAM redundancy techniques. For example, the Redundancy 112-R may be arranged in groupings or blocks e.g., redundant rows (not explicitly visible in FIG. 1), and redundant columns (not explicitly visible in FIG. 1). In an aspect, such blocks, or portions of such blocks of the Redundancy 112-R can selectively activated to replace, for example, blocks or portions of blocks, e.g., rows (not separately visible in FIG. 1), columns (not explicitly visible in FIG. 1), portions of rows and/or portions columns, of the nominal active DRAM area 112-A, as described in further detail later in this disclosure. In an aspect, the processor 102 may further include a random access memory 107 (hereinafter "RAM 107") local to the memory controller 106, to enable various operations further to processes according to the exemplary aspects.

In an aspect, one-time programmable circuitry that is associated with the Redundancy 112-R may be programmed, as described in further detail later in this disclosure, in a succession of pulsed one-time programming (OTP) iterations. In a further aspect, the iterations may be synchronized with non-refresh intervals (NRIs) that can occur between the periodic burst refreshes, and each iteration may program another portion of the one-time programmable circuitry. For convenience in describing examples, such pulsed OTP operations timed or synchronized with burst refreshes, will be alternatively referred to in the disclosure as "pulsed OTP with continuing refresh" or "pulsed OTP-WCR repair." It will be understood that "WCR," as used in this disclosure, is an abbreviation of "with continuing refresh" and has no additional or inherent meaning, and imports no external meaning into this disclosure Continuing to refer to FIG. 1, a DRAM access line or bus, such as the example labeled "DQ," may connect the memory controller 106 to a read-write control block (RD_WT_BLK) 114 of the DRAM local control logic 110. A dedicated control line, such as the back channel 116, may connect the memory controller 106 directly to an error control code logic block (ECC_BLK) 118 of the DRAM local control logic 110. In an aspect, the ECC_BLK 118 may be configured to check for bit errors in data read from the nominal active DRAM area 112-A. The ECC_BLK 118 may be configured to generate an error detect signal, e.g., "ECC_Flag," in response to detecting errors meeting a given criterion, or one of a plurality of given criteria. The criteria may be set such that the detected error qualifies invocation of repair of the DRAM device 108. One example criterion that may be set, for detected errors in the DRAM device 108 to qualify for invocation of repair, may be the detected bit error being not correctable and thus indicating a failed address in the DRAM device 108. As illustration, the ECC_BLK 118 or other circuitry in the DRAM local control logic 110 may be configured to correct single bit errors in data read from the DRAM cell array 112, but only to detect, and not correct two-bit errors. The ECC_BLK 118 may in such an example configuration be further configured to generate the ECC_Flag upon detecting two-bit errors. Another example criterion may be a repeated error from a particular address or address range in the DRAM area 112-A. It will be understood that the above-described example configurations of the ECC_BLK 118, namely, to correct single bit errors, and detect but not correct two-bit errors, and generate the ECC_Flag or equivalent, are only for purposes of example, and are not intended to limit the scope of any of the exemplary aspects.

Referring to FIG. 1, the DRAM local control logic 110 may further include an augmented mode register set block 120 (hereinafter "MRS_BLK_RP" 120). The MRS_BLK_RP 120 may be configured with mode registers (not separately visible in FIG. 1) for holding DRAM control information according to conventional mode register techniques, in addition to information (not separately visible in FIG. 1) for use in repairing a failed address as described in further detail later in this disclosure. In an aspect, the DRAM local control logic 110 may include a DRAM control block 122 (hereinafter "DRAM_CTRL_BLK 122"). The DRAM_CTL_BLK 122 may be configured to control, for example, conventional DRAM refresh operations that maintain validity of data content in the DRAM cell array 112. Such operations by the DRAM_CTL_BLK 122 may be based, at least in part, on a content of the MRS_BLK_RP 120. Features of the DRAM_CTL_BLK 122 other than control of operations specific to the pulsed OTP-WCR repair operations according to the exemplary aspects may be in accordance with known, conventional DRAM control techniques and, therefore, further detailed description of such features is omitted.

Referring to FIG. 1, in an aspect, the DRAM local control logic 110 may also include a command address block 124 (hereinafter "CMD_ADD_BLK 124") that may be configured to provide, for example, address information to a refresh-synched pulsed OTP control block 126 (hereinafter "OTP-WCR_CTL 126"). The OTP-WCR_CTL 126 may be configured, in turn, to program, i.e., selectively blow fuses in, the OTP fuse block 128 (hereinafter "OTP_FUSE_BLK 128").

In an aspect, example operations in one process of pulsed OTP-WCR repair, in accordance with various exemplary aspects may begin with a controller receiving a notice of a DRAM failed address. For example, referring to FIG. 1, the ECC_BLK 118 of the DRAM local control logic 110 may detect a bit error, e.g., a two-bit error in a data read from the DRAM cell array 112. The ECC_BLK 118 may, in response, send the ECC_FLAG, or an equivalent, to the memory controller 106 in the processor 102.

Referring to FIG. 1, example operations in one pulse OTP-WCR process, performed on the processor system 100 for illustration, will be described. Example operations may include the ECC_BLK 118 detecting a failed address in the DRAM cell array 112 and, in response, sending a failed address signal, such as the ECC_Flag, to the memory controller 106 in the processor 102. In an aspect, the ECC_BLK 118 may send the ECC_Flag over the back channel 116. In association with detecting the failed address, the ECC_BLK 118 may load repair parameters (not separately shown) into the MRS_BLK_RP 120. The memory controller 106 may, in response to receiving the ECC_Flag, send a command signal, for example, a pulsed OTP-WCR program mode control signal (not separately visible in FIG. 1, but described in further detail in reference to FIG. 2) to the DRAM local control logic 110. The DRAM local control logic 110 may be configured to respond to the pulsed OTP-WCR program mode control signal by switching the DRAM device 108 to a pulsed OTP-WCR programming mode. The DRAM local control logic 110 may be configured to also provide its own programming information, either as a default or additional to information from the memory controller 106.

In an aspect, the OTP-WCR_CTL block 126 of the DRAM local control logic 110 may, either prior to or in association with receiving the programming information from the memory controller 106, determine a target region of the fuses in the OTP_FUSE_BLK 128 to program to effectuate repair of the failed address(es) identified by the ECC_BLK 118. The target region of the fuses in the OTP_FUSE_BLK 128 may correspond to a region (not separately visible in FIG. 1) in the Redundancy 112-R that, when activated, may replace the failed address(es) identified by the ECC_BLK 118.

Referring to FIG. 1, after the OTP-WCR_CTL block 126 determines the target region of the fuses in the OTP_FUSE_BLK 128, a first iteration of a pulsed OTP-WCR operation may be performed on the OTP_FUSE_BLK 128. The first iteration may be on a first portion of the target region of fuses in the OTP_FUSE_BLK 128. Regarding the size of the first portion (and remaining portions), operations in pulsed OTP-WCR repair according to various exemplary embodiments can include determining a maximum burst programming portion. For brevity, the phrase "maximum burst programming portion" will alternatively referred to in an abbreviated form as "MBP." The MBP can be the maximum number of addresses, or fuses that can be programmed during a given NRI. In a further aspect, the MBP may be determined based on the length of the NRI and the per-address (or per-fuse) programming time. In an aspect, the MBP may be determined based on dividing the NRI by a per-address (or per-fuse) programming time. As illustration, assigning a normalized per-address (or per-fuse) programming time of one time unit, and a 100 time unit length of the NRI, the MBP would be 100. In an aspect, MPB may be predetermined, as opposed to being re-calculated each time the DRAM is switched to its pulsed OTP repair mode for pulsed OTP repair according to various exemplary embodiments.

Referring to FIG. 1, according to various exemplary aspects, the first iteration of the pulsed OTP-WCR operation (and all subsequent iterations) may be synchronized to follow a burst refresh on the DRAM cell array 112. The burst refresh on the DRAM cell array 112 that is followed by the first iteration of the pulsed OTP-WCR operation may be termed "a DRAM first burst refresh." After the first iteration of the pulsed OTP-WCR operation, a second burst refresh may be applied to the DRAM cell array 112. It will be understood that a time interval between an end of the first burst refresh and the start of the second burst refresh may be the NRI (non-refresh interval) described earlier in this disclosure. The MBP value, i.e., the number of fuses in the OTP_FUSE_BLK 128 programmed by the first iteration of the pulsed OTP-WCR operation, may therefore be set such that first iteration of the pulsed OTP-WCR is less than NRI.

Assuming the first portion is less than the target region of the fuses in the OTP_FUSE_BLK 128, a second iteration of a pulsed OTP-WCR operation may be performed. In an aspect, a failure address range may be such that, for a given NRI and a given MBP, additional iterations may be required to program the entire target region fuses in the OTP_FUSE_BLK 128. The required total quantity of iterations may be labeled "K." Each of the K iterations may follow another burst refresh on the DRAM cell array 112. The iterations may be concatenated such that the K iterations of the pulsed OTP-WCR operations are synchronized, e.g., in an interleaved manner, with K consecutive burst refreshes on the DRAM cell array 112.

Referring to FIG. 1, the quantity "K" may be calculated, for example, by the memory controller 106. In an aspect, the above-described iterations may be counted until the count reaches K. The event of the count reaching K may be considered a termination condition for ending the pulsed OTP-WCR operation. In another aspect, instead of counting the iterations, a determination may be made after each iteration of the pulsed OTP-WCR operation, as to whether programming of the target region of the OTP_FUSE_BLK 128 is completed. If the answer is "no," another iteration of the pulsed OTP-WCR operation may be applied.

In an aspect, upon completing the programming of the target region fuses in the OTP_FUSE_BLK 128 a verification of the programming may be performed. The verification may utilize conventional techniques for verifying one-time programming of fuses in a redundancy circuit. Such conventional verification techniques are known to persons of ordinary skill and can be readily adapted by such persons upon reading this disclosure to practice according to its aspects and, therefore, further detailed description is omitted.

Figure 2:
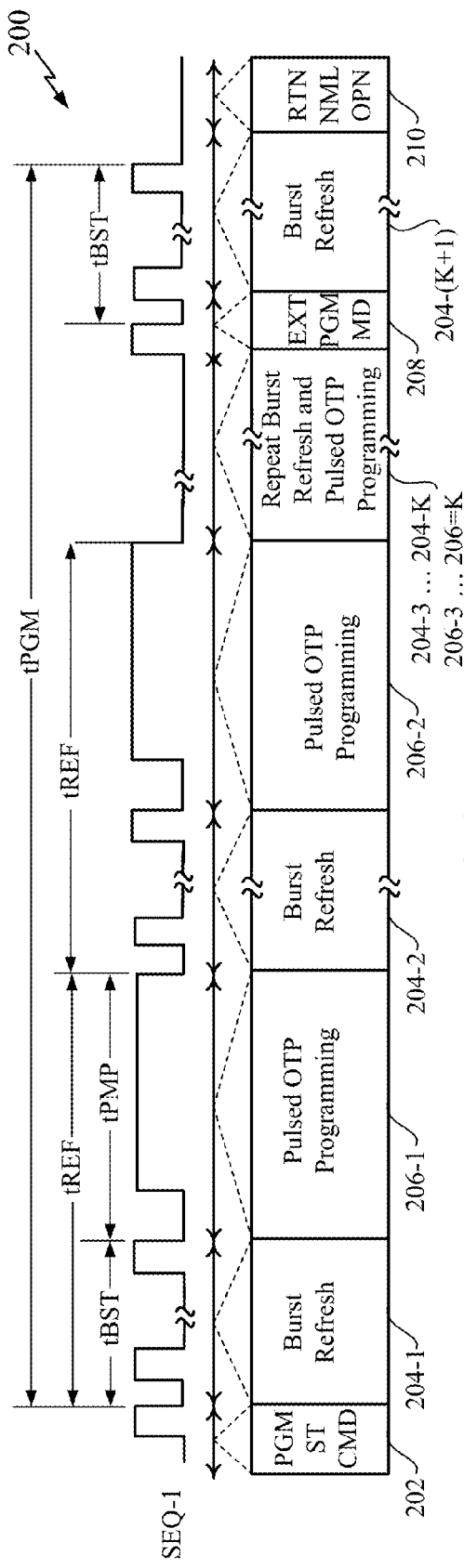
FIG. 2 shows an illustrative event sequence of example operations in one OTP burst repair process according to one or more aspects.

FIG. 2 shows a diagram 200 of an illustrative event sequence and related operations in one OTP burst repair process according to one or more aspects. Example events and example operations in the diagram 200 will be collectively referred to as a "repair sequence 200." Example operations associated with the repair sequence 200 will be described in reference to the FIG. 1 processor system 100. Description of example operations in the repair sequence 200 will assume that a failed address has been detected, for example, by the FIG. 1 ECC_BLK 118, and that a pulsed OTP-WCR repair controller, for example, the FIG. 1 memory controller 106 has been notified of the failed address.

Referring to FIG. 2, operations in the repair sequence 200 may start at 202, with a "program start command" (PGM ST SMD) being sent to the DRAM to switch the DRAM to a pulsed OTP-WCR mode. The PGM ST CMD may be sent, for example, from the FIG. 1 memory controller 106 to the DRAM local control logic 110. Next, at 204-1 a first burst refresh 204-1 may be applied to the DRAM cell array 112. The first burst refresh 204-1 may have a time duration tBST. It will be understood that "first," in the context of "first burst refresh 204-1" simply means the first burst refresh after the PGM ST CMD at 202. In other words, the K+1 burst refreshes (204-1 . . . 204-(K+1)) visible on FIG. 2 may simply be a window of K+1 of a continuing sequence of burst refreshes that precedes, spans, and continues after the repair sequence 200.

Referring to FIG. 2, after the first burst refresh 204-1, a first pulsed OTP-WCR operation 206-1 may be performed. Referring to FIGS. 1 and 2, the first pulsed OTP-WCR operation 206-1 may program a first portion of a target region of fuses in the OTP_FUSE_BLK 128. The first pulsed OTP-WCR operation 206-1 may have a time duration tPMP. Next, at 204-2, a second burst refresh 204-2 may be applied to the DRAM cell array 112. The second burst refresh 204-2 may have the same time duration, tBST, as the first burst refresh 204-1. It may be assumed that all burst refreshes (e.g., 204-1 . . . 204-(K+1)) have the same time duration, tBST. It may also be assumed that the burst refreshes, (e.g., 204-1 . . . 204-(K+1)) are periodic, and that the period may remain constant at tREF. Therefore, the start of the second burst refresh 204-2 may occur tREF after the start of the first burst refresh 204-1. The difference between tREF and tBST may therefore be an example of NRI, which is described previously in this disclosure. Accordingly, it will be understood that tPMP, the time duration of the first pulsed OTP-WCR operation, must be less than the difference between tREF and tBST.

Continuing to refer to FIG. 2, after the second burst refresh 204-1, a second pulsed OTP-WCR operation 206-2 may be performed. Referring to FIGS. 1 and 2, the second pulsed OTP-WCR operation 206-2 may program a second portion of a target region of fuses in the OTP_FUSE_BLK 128. Assuming the first pulsed OTP-WCR operation 206-1 and the second pulsed OTP-WCR operation 206-2 are not sufficient to complete the programming of the target region of the fuses in the OTP_FUSE_BLK 128, additional pulsed OTP-WCR operations 206-3 . . . 206-K may be performed. The term "iteration(s) 206 of the pulsed OTP-WCR operation" (not separately appearing on FIG. 2) is hereby introduced as a generic reference to the pulsed OTP-WCR operations 206-1 . . . 206-K. The term "burst refresh 204" (not separately appearing on FIG. 2) is hereby introduced as a generic reference to the burst refresh 204-1 . . . 204-(K+1). Each iteration 206 of the pulsed OTP-WCR operation, from the pulsed OTP-WCR operation 206-3 to the pulsed OTP-WCR operation 206-K, may be timed to immediately follow a corresponding burst refresh 204. For example, a third pulsed OTP-WCR operation 206-3 may be timed to immediately follow a third burst refresh 204-3. Likewise, the Kth pulsed OTP-WCR operation 206-K may be timed to immediately follow a Kth burst refresh 204-K.

Referring to FIG. 2, the iterations 206 of the pulsed OTP-WCR operation may continue until a termination condition is met. As describe previously in this disclosure, the termination condition may be a count of the iterations meeting a pre-calculated count, e.g., K. Alternatively, the termination condition may be a determination that all portions of the target region of fuses in the OTP_FUSE_BLK 128 have been programmed. In an aspect, upon the termination condition being met, an "exit program mode" (EXT PGM MD) command may be sent, for example, to the DRAM local control logic 110, to exit the pulsed OTP-WCR program mode. In an aspect, the DRAM device 108 may apply another burst refresh 204-(K+1) to the DRAM cell array 112, after exiting the pulsed OTP-WCR program mode. Next, at 210, the repair sequence may return the DRAM device 108 to a normal operation. A total time for the repair sequence may be tPGM. Optionally, prior to the return at 210 to a normal operating state, a verification (not explicitly visible on FIG. 2) may be applied to verify successful operation of the now-active target portion of the Redundancy 112-R.

In one alternative aspect, a controller such as the memory controller 106 in the processor 102 may control a burst OTP-WCR repair sequence, using burst auto-refresh.

Figure 3:
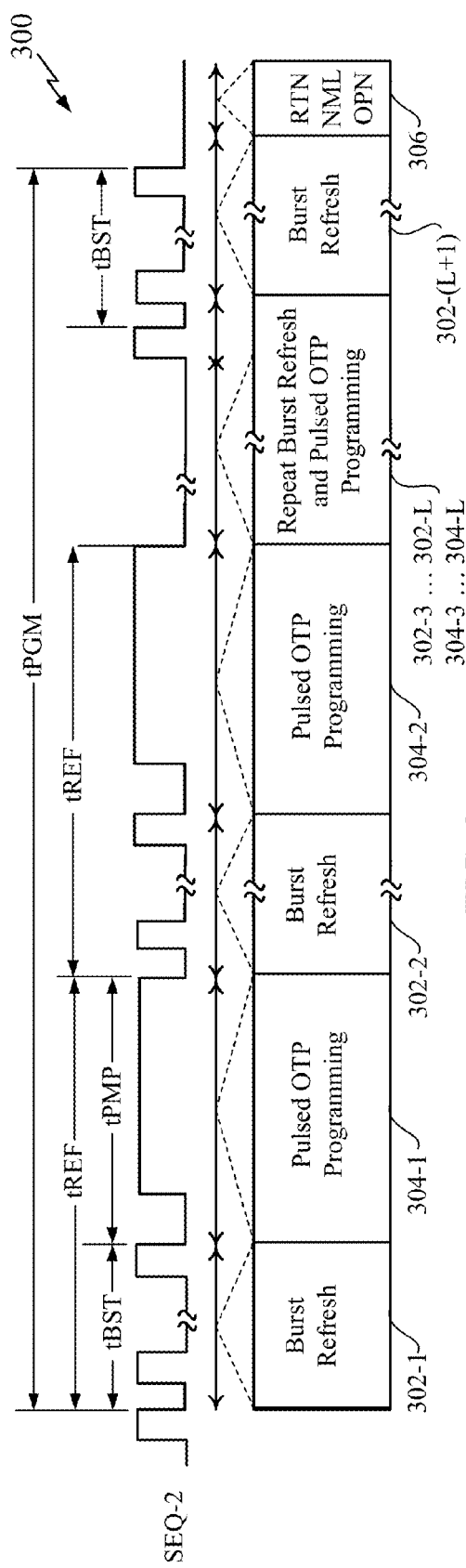
FIG. 3 shows an illustrative event sequence of example operations in one alternative OTP burst repair process according to one or more aspects.

FIG. 3 shows a diagram 300 of an illustrative event sequence of example operations in one alternative OTP burst repair process, according to one or more exemplary aspects. Example events and example operations in the diagram 300 will be collectively referred to as a "repair sequence 300." Described example operations in the repair sequence 300 will assume a failed address has been detected, and a pulsed OTP-WCR repair controller, for example, the FIG. 1 memory controller 106, has been notified of the failed address.

Referring to FIG. 3, operations in the repair sequence 300 may include, after a first burst refresh 302-1, a first pulsed OTP-WCR operation 304-1. The first pulsed OTP-WCR operation 304-1 may include a controller, e.g., the memory controller 106, sending a command to the DRAM device 108 to program a first portion of a target region of fuses in the OTP_FUSE_BLK 128. The first burst refresh 302-1, and all other burst refreshes in (and preceding and following) the repair sequence 300, may have the time duration tBST described previously in this disclosure. Also, the first pulsed OTP-WCR operation 304-1, and all other of the pulsed OTP-WCR 304 operations in the repair sequence 300, may have the time duration tPMP described previously in this disclosure. After the first pulsed OTP-WCR operation 304-1, a second burst refresh 302-2 may be applied to DRAM cell array 112. After the second burst refresh 302-2, a second pulsed OTP-WCR operation 304-2 may be performed. The second pulsed OTP-WCR operation 304-2 may program a second portion of the target region of fuses in the OTP_FUSE_BLK 128.

Referring to FIG. 3, it will be assumed that the first pulsed OTP-WCR operation 304-1 and the second pulsed OTP-WCR operation 304-2 are not sufficient to complete the programming of the target region of the fuses in the OTP_FUSE_BLK 128. Accordingly, additional pulsed OTP-WCR operations 304-3 . . . 304-L may be performed. The term "iteration(s) 304 of the pulsed OTP-WCR operation" (not separately appearing on FIG. 3) is hereby introduced as a generic reference to the pulsed OTP-WCR operations 304-1 . . . 304-L. Each iteration 304 of the pulsed OTP-WCR operation, from the pulsed OTP-WCR operation 304-3 to the pulsed OTP-WCR operation 304-L, may be timed to immediately follow a corresponding burst refresh 302. Iterations 304 of the pulsed OTP-WCR operation may continue until a termination condition is met, e.g., a count of the iterations meeting a pre-calculated count, or a determination that all portions of the target region of fuses in the OTP_FUSE_BLK 128 have been programmed. After the termination condition is met, the DRAM device 108 may apply another burst refresh 302-(L+1) to the DRAM cell array 112. Next, at 306, the repair sequence 300 may return the DRAM device 108 to a normal operation. Optionally, prior to the return at 306 to a normal operating state, a verification (not explicitly visible on FIG. 3) may be applied to verify successful operation of the now-active target portion of the Redundancy 112-R.

Figure 4:
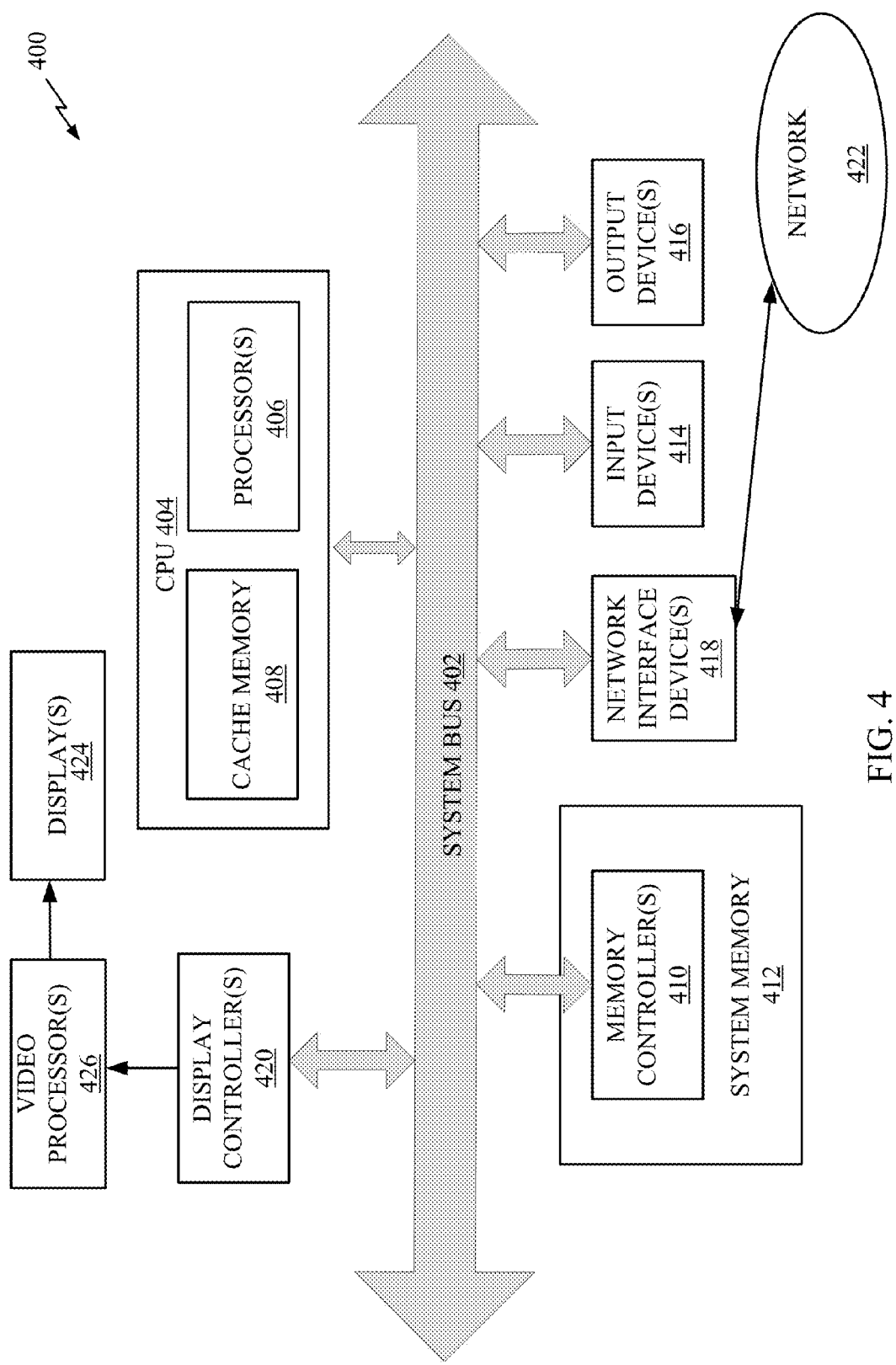
FIG. 4 shows a functional schematic of one example personal communication and computing device accordance with one or more exemplary aspects.

FIG. 4 illustrates one example of a personal communication and computing device 400 that can be configured, as described herein, to support or provide functionalities and features described in reference to the FIG. 1 processor system 100. Referring to FIG. 4, the personal communication and computing device 400 can include a system bus 402 and, coupled to the system bus 402, one or more CPUs 404. The CPUs 404 may comprise, for example, one or more processors 406 and one or more cache memories 408. The CPU(s) 406 may be implemented by, for example, one or more programmable computing devices such as, without limitation, one or more ARM-type processing devices (not separately visible in FIG. 4). The CPU(s) 406 may capable of performing as a master device. The CPU(s) 406 may be inter-coupled, for example through the system bus 402, to various master and slave devices. The CPUs 404 may, according to conventional communication protocols, communicate with these other devices by exchanging address, control, and data information over the system bus 402. Although not illustrated in FIG. 4, multiple system buses 402 may be provided. In examples having multiple system buses 402, each system bus 402 may constitute a different fabric.

Referring to FIG. 4, the CPU(s) 404 may communicate bus transaction requests to a memory controller 410 of a memory system 412 as one example of a slave device.

In an aspect, one or more of the system bus 402, the CPU(s) 404 and the memory system 412 may include, or support a dedicated control line (not explicitly visible in FIG. 4), such as the FIG. 1 back channel 116, to connect the memory controller 410 or equivalent directly to an error control code logic block (not explicitly visible in FIG. 4) having functionality such as the FIG. 1 ECC_BLK 118 of the DRAM local control logic 110. In one aspect, the CPU 404 and memory controller 410 may correspond to processor 102 of FIG. 1, and system memory 412 may correspond to DRAM device 108. However, those having skill in the art will appreciate that the various elements of FIG. 1 may be distributed throughout the computing device 400 in other arrangements without departing from the spirit of this disclosure, as will be described in further detail with reference to FIG. 5.

Referring to FIG. 4, examples of other master and slave devices can include one or more input devices 414, one or more output devices 416, one or more network interface devices 418, and one or more display controllers 420. The input devices(s) 414, if employed, can include any type of input device, including but not limited to input keys, switches, voice processors, and the like. The output device(s) 416, if used, can include any type of output device, including but not limited to audio, video, other visual indicators and the like. The network interface device(s) 418, if used, can be any type of network interface device configured to allow exchange of data to and from a network 422. The network 422 can be any type of network, including but not limited to a wired or wireless network, a private or public network, a local area network (LAN), a wide area network (WLAN) and the Internet. The network interface device(s) 418 can be configured to support any type of communications protocol desired.

Continuing to refer to FIG. 4, the CPU(s) 404 may also be configured to access the display controller(s) 420 over the system bus 402 to control information sent to one or more displays 424. The display controller(s) 420 may send information to the display(s) 424 to be displayed, for example, via one or more video processors 426. The video processors 426 may. For example, process information to be displayed into a format suitable for the display(s) 424. The display(s) 424, if used, can include any type of display, for example, an active or passive liquid crystal display (LCD), a plasma display, and cathode ray tube (CRT).

Figure 5:
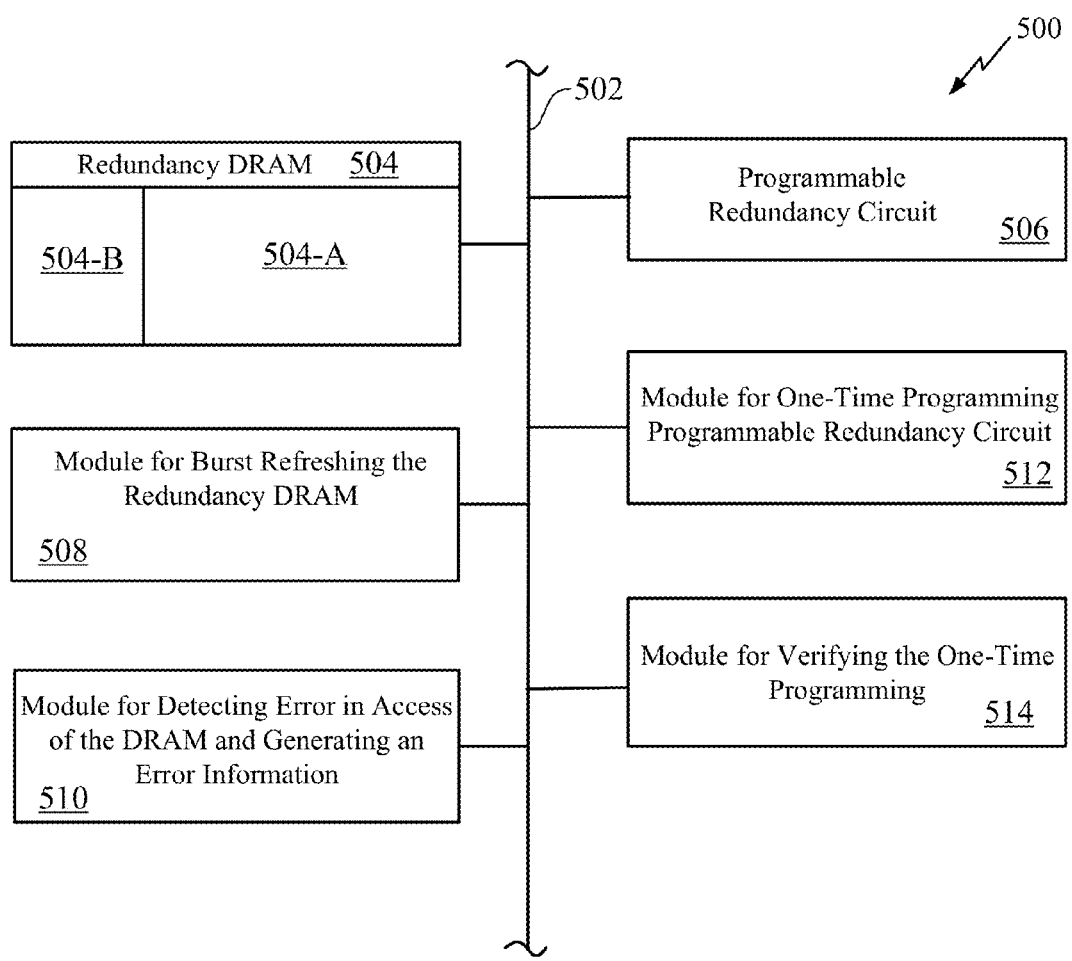
FIG. 5 shows a functional module block schematic of one example processor system with in-system error managed memory, configured in accordance with one or more aspects.

FIG. 5 shows a functional module schematic of one example apparatus 500 with in-system error managed memory, configured in accordance with one or more exemplary aspects. Referring to FIG. 5, the apparatus 500 may include an interconnect 502 and a DRAM 504. The DRAM 504 may be a redundancy-equipped DRAM having a nominal cell area 504-A and a redundancy cell area 504-B. The redundancy cell area 504-B may be alternatively referred to as a "redundancy resource" 504-B. The DRAM 504 may be implemented, for example, in whole or in part, by the FIG. 1 DRAM device 108. In an aspect, the apparatus 500 may include a programmable redundancy circuitry 506. The programmable redundancy circuitry 506 may include selectively blowable fuses (not separately visible in FIG. 5) for a one-time programmable mapping addresses of memory cells (e.g., rows, columns, portions of rows, portions of columns) in the nominal cell area 504-A to corresponding redundant memory cells in the redundancy resource 504-B. Referring to FIGS. 1 and 5, the programmable redundancy circuitry 506 may be implemented, for example, by the OTP_FUSE_BLK 128.

Referring to FIG. 5, the apparatus 500 may include module 508 for burst refreshing the DRAM 504. Referring to FIGS. 1 and 5, example implementations of the module 508 may include the DRAM_CTRL_BLK 122, in combination with certain functional aspects of the MRS_BLK_RP 120. Referring to FIGS. 1, 4 and 5, functionality of circuitry such as the described DRAM_CTRL_BLK 122 and MRS_BLK_RP 120 in performing burst refreshing to implement module 508 may be provided, for example, by the memory controller 410, or by circuitry (not explicitly visible in FIG. 4) internal to the system memory 412.

The apparatus 500 may include a module 510 for detecting an error in an access of the DRAM 504 and, in response, generating error information. The error information may, for example, identify a fail address of the redundancy DRAM 504. Referring to FIGS. 1 and 5, one example implementation of the module 510 may be, or may include, the ECC_BLK (error control code logic block) 118 of the DRAM local control logic 110. Referring to FIGS. 1, 4 and 5, functionality of circuitry such as the described ECC_BLK 118 in error detection to implement module 510 may be provided, for example, by the memory controller 410, or by circuitry (not explicitly visible in FIG. 4) internal to the system memory 412.

Referring to FIG. 5, the apparatus 500 may include a module 512 for applying, in response to receiving the error information from module 510, one-time programming operations to the programmable redundancy circuitry 504-B, while maintaining a content of the redundancy DRAM 504 as valid. In an aspect, the module 512 may be configured to apply the one-time programming iteratively, for example, as K or L iterations as described in reference to FIGS. 1-3. In an aspect, associated with maintaining validity of a content of the DRAM 504 while applying one-time programming operations to the programmable redundancy circuitry, the module 512 and the module 508 may be configured exchange information enabling the module 512 to synchronize iterations of the on-time programming with the module 508 burst refreshes of the DRAM 504. In an aspect, the module 512 may be configured to apply programming to the redundancy circuitry 506 in a loop manner, e.g., repeating iterations until a termination condition is met.

Referring to FIGS. 1 and 5, implementation of the above-described functionality of the module 512 may be provided by the described features of the memory controller 106 and DRAM local control logic 110. For example, the above-described functionality of the module 512 may be provided by the FIG. 1 OTP-WCR_CTL block 126 in determining a target region of the fuses in the OTP_FUSE_BLK 128 to program to repair of the failed address(es) identified by the ECC_BLK 118, and controlling iterative programming of the on the OTP_FUSE_BLK 128. Referring to FIGS. 1, 4 and 5, functionality of circuitry such as the described memory controller 106 and DRAM local control logic 110, including its OTP-WCR_CTL block to implement module 510 may be provided, for example, by the memory controller 410, or by circuitry (not explicitly visible in FIG. 4) internal to the system memory 412.

Referring to FIG. 5, in an aspect the apparatus 500 may include a module 514, for verifying, for example, after programming iterations by the module 512, whether the programming is successful. Referring to FIGS. 1 and 5, one example implementation of the module 514 may be, or may include, the memory controller 106 and the DRAM local control logic 110. Referring to FIGS. 1, 4 and 5, functionality of circuitry to implement module 514 may be provided, for example, by the memory controller 410, or by circuitry (not explicitly visible in FIG. 4) internal to the system memory 412.

As described, functionality of the FIG. 5 functionality of the FIG. 5 modules may be implemented as a processing system, such as the FIG. 4 example personal communication device processor system 400. There are various alternative and additional implementations consistent with this disclosure. In an aspect, the functionality of the FIG. 4 modules may be implemented using, for example, at least a portion of one or more integrated circuits (e.g., an ASIC). It will be appreciated by those skilled in the art that a given subset (e.g., of an integrated circuit and/or of a set of software modules) may provide at least a portion of the functionality for more than one module. As one specific example, the apparatus 500 may comprise a single device (e.g., the redundancy DRAM 504, programmable redundancy circuitry 506 and modules 508 through 512 comprising different sections of an ASIC). As another specific example, the apparatus 500 may comprise several devices (e.g., the redundancy DRAM 504 comprising one ASIC, module 508 comprising another ASIC, and modules 510, 512 and 514 comprising yet another ASIC).

The foregoing disclosed devices and functionalities, e.g., as described in reference to any one or more of FIGS. 1-5, may be designed and configured into computer files (e.g., RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then employed in devices described above.

Figure 6:
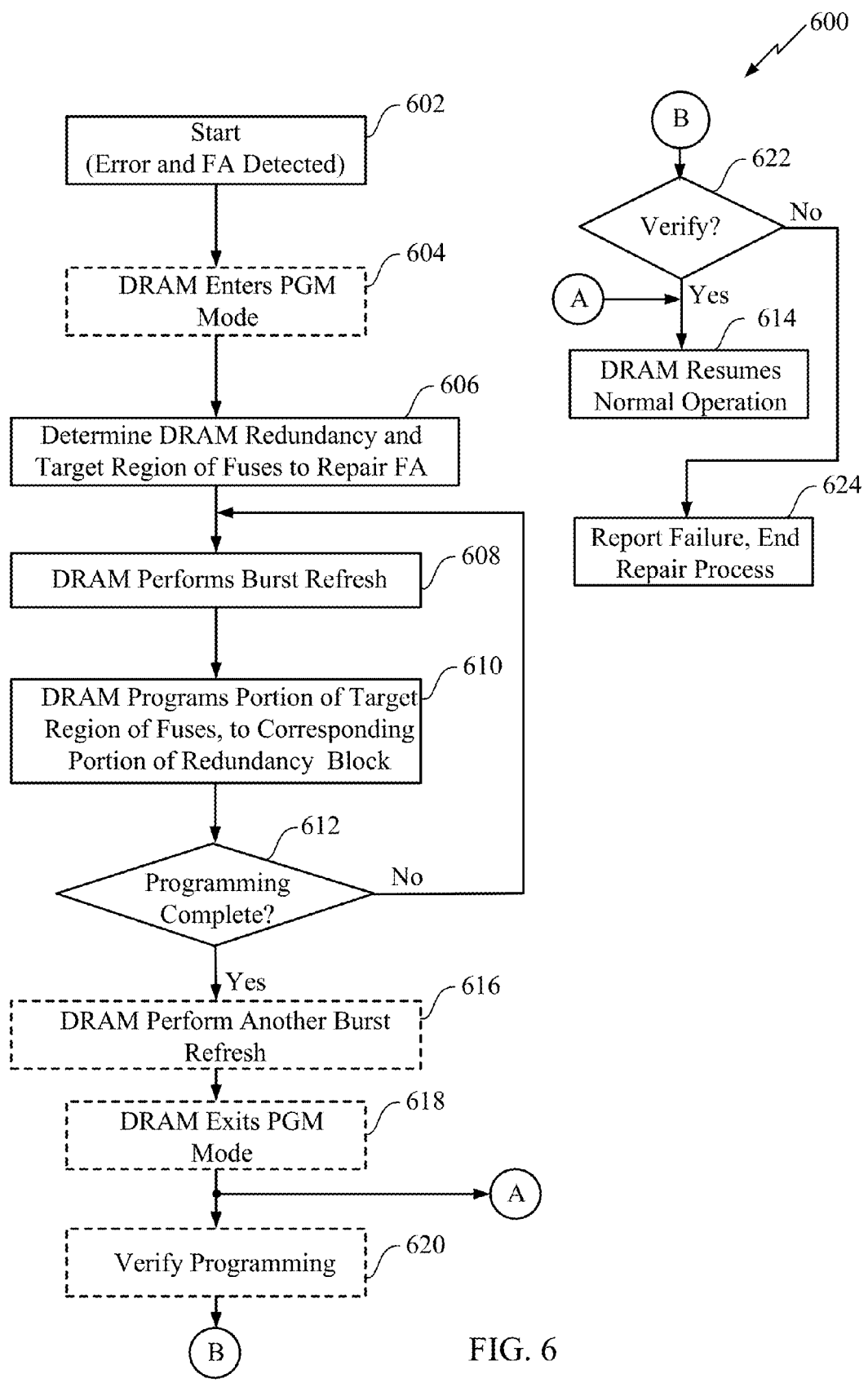
FIG. 6 shows a flow diagram of example operations in and associated with one or repair processes according to various exemplary aspects

FIG. 6 shows a flow diagram 600 of example operations in and associated with one or more pulsed OTP-WCR repair processes according to various exemplary aspects.

Referring to FIG. 6, example operations can start at 602, where a DRAM failed address is detected. As illustration, referring to FIGS. 1 and 6, example operations at 602 may include the ECC_BLK 118 detecting an error qualifying for invocation of repair and, in response, sending a notification, such as the ECC_Flag. Referring to FIGS. 5 and 6, example operations at 602 may be performed by the module 510 detecting an error in access of the DRAM 504 and, in response, sending error information to module 512.

Referring to FIG. 6, in an aspect, in response to detecting the DRAM failed address at 602, the DRAM (e.g., DRAM 504) may at 604 itself switch to a pulsed OTP-WCR repair mode, as described previously in this disclosure. In another aspect, in place of 604, a controller external to the DRAM, e.g., the FIG. 1 memory controller 106, may control the DRAM to carry out a pulsed OTP-WCR repair, e.g., as described in reference to FIG. 3. After switching, or being switched to a pulsed OTP-WCR repair mode, DRAM redundancy and a corresponding target region of fuses for one-time programming may be determined Referring to FIGS. 1 and 6, example operations at 606 can include DRAM local control logic 110, e.g., the CMD_ADD_BLK 124, determining a target region in the OTP_FUSE_BLK 128 that corresponds to a region in the Redundancy 112-R that may replace the failed address. Referring to FIGS. 5 and 6, example operations at 606 may include the module 512 determining the target region in the programmable redundancy circuitry 506.

Referring to FIG. 6, after determining the target region in the programmable circuitry, operations may include, at 608, applying a burst refresh to the DRAM. It will be understood that "applying a burst refresh" is not necessarily particular to detecting the DRAM failed address at 602. The "burst refresh" may, for example, be a normally scheduled burst refresh that happens to occur after detecting the DRAM failed address at 602. Referring to FIGS. 2 and 6, one example burst refresh at 608 can be the FIG. 2 first burst refresh 204-1. Referring to FIGS. 3 and 6, another example burst refresh at 608 can be the FIG. 3 first burst refresh 302-1. Referring to FIGS. 5 and 6, the burst refresh at 608 may be performed, for example, by the module 508 in the course of its periodic burst refreshing the DRAM 504.

Referring again to FIG. 6, after the burst refresh at 608 a first pulsed OTP-WCR operation may be applied, at 610, to program a portion of the target fuse region identified at 606. Referring to FIGS. 2, 3 and 6 examples of the first pulsed OTP-WCR operation at 610 can include the FIG. 2 first pulsed OTP-WCR operation 206-1, and the FIG. 3 first pulsed OTP-WCR operation 304-1. Referring to FIGS. 5 and 6, the first pulsed OTP-WCR operation at 610 may be performed, for example, by the module 512. In an aspect, the module 512 may obtain information from the module 508 to synchronize the first pulsed OTP-WCR operation to not interfere with the first burst refresh at 608. Referring to FIG. 6, after the first pulsed OTP-WCR operation at 610, a determination is made at 612 of whether a termination condition, e.g., a completion of programming, is met. Referring to the FIGS. 2 and 6, described operations associated with iterations 206-3 . . . 206-K include determining whether a termination condition is met, and therefore can be examples of the determination at 612. Similarly, referring to the FIGS. 3 and 6, described operations associated with iterations 304-3 . . . 304-L include determining if a termination condition is met, and therefore can also be examples of the determination at 612. Referring to FIGS. 5 and 6, example operations at 612 of determining whether a termination condition, e.g., completion of programming the target region of the fuses, may be performed, for example, by the module 512.

Referring FIG. 6, in an aspect, upon a "YES" at 612 operations may go directly to 614 and resume normal DRAM operation. According to this aspect, the programming at 610 is not necessarily verified. In another aspect, upon a YES at 612, operations may go to 616, perform another burst refresh and then, at 618, the DRAM may exit its pulsed OTP-WCR repair mode. In an aspect, after exiting the pulsed OTP-WCR programming mode at 618, operations may go to 614 and resume normal operation.

Referring to FIG. 6, in an aspect, upon a "NO" at 612, operations loop back to 608 repeat a burst refresh of the DRAM, and then to 608 to program another portion of the target region of fuses. In the first iteration from 608 to 610 to 612, the pulsed OTP-WCR programming at 610 may program a first portion of the target region of the target region. If the determination at 612 is that programming is complete, that first portion may be the complete portion. If the determination at 612 is that the programming is not complete, the first loop back to 608 will result in OTP-WCR programming at 610 of a second portion of the target region.

In another aspect, after exiting the pulsed OTP-WCR programming mode at 612, or immediately after the additional burst refresh at 616, operations may, at 620, verify the success of the programming. If the verification at 620 shows success, shown as a YES branch from the decision block 622, normal operation may be resumed at 614. If the verification at 620 shows error, shown as a NO branch from the decision block 622, operations at 624 may be performed, including a report or a failure and an ending of the repair process. Referring to FIGS. 4 and 6, example operations at 620 and 622 verifying the success of the programming performed by repeats of 610 may be performed, for example, by the module 514.

Exemplary aspects and their respective example aspects have been described hereinabove in reference to in-system repair of DRAM devices having redundancy resources. It will be understood that the exemplary aspects are not limited to practices in conjunction with DRAM devices. On the contrary, various exemplary aspects that can provide novel in-system repair of other memory devices, e.g., static RAM, are contemplated.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described herein may be embodied directly in hardware, in a software module or module(s) executed by a processor, or in a combination of the two. To illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

With respect to software modules, a software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

While the foregoing disclosure shows illustrative aspects of the invention, it should be noted that various changes and modifications could be made herein without departing from the scope of the invention as defined by the appended claims. The functions, steps and/or actions of the method claims in accordance with the aspects of the invention described herein need not be performed in any particular order. Furthermore, although elements of the invention may be described or claimed in the singular, the plural is contemplated unless limitation to the singular is explicitly stated.

What is claimed is:

1. A method for repair of a random access memory (RAM) having a redundancy circuit, comprising:
   receiving error information, wherein the error information identifies a fail address of the RAM; and
   in response to the error information, applying a one-time programming to the redundancy circuit and, while applying the one-time programming to the redundancy circuit, maintaining a content of the RAM in a valid state, wherein maintaining the content of the RAM in the valid state comprises applying a plurality of refresh bursts to the RAM, each refresh burst of the plurality of refresh bursts spaced apart by a non-refresh interval that includes the end of a refresh burst and a start of a next refresh burst of the plurality of refresh bursts, wherein applying the one-time programming comprises applying the one-time programming between the end of the refresh burst and the start of the next refresh burst, and wherein the one-time programming has a duration that is less than a duration of the non-refresh interval.

2. The method of claim 1, wherein the error information includes information identifying a target region of the redundancy circuit, and wherein the target region of the redundancy circuit corresponds to the fail address.

3. The method of claim 2, wherein applying the one-time programming to the redundancy circuit comprises one-time programming at least a portion of the target region of the redundancy circuit and, while one-time programming at least the portion of the target region, maintaining the content of the RAM in the valid state.

4. The method of claim 2, wherein applying the one-time programming is a first iteration of the one-time programming, wherein the first iteration of the one-time programming programs at least a first portion of the target region, and wherein the method further comprises:
   applying a second iteration of the one-time programming to at least a second portion of the target region of the redundancy circuit.

5. The method of claim 1, wherein the one-time programming is an iteration of one-time programming that programs at least a portion of the redundancy circuit that corresponds to at least a portion of the fail address, and wherein the method further comprises:
   applying another iteration of one-time programming that programs at least another portion of the redundancy circuit that corresponds to at least another portion of the fail address.

6. The method of claim 5, further comprising repeating the applying another iteration of the one-time programming to the redundancy circuit, while maintaining the content of the RAM in a valid state, until a termination condition is met.

7. The method of claim 6, wherein the termination condition comprises a completed programming condition.

8. The method of claim 7, further comprising:
   upon determining the completed programming condition is met, verifying a success of the one-time programming; and
   generating a report in response to the verifying indicating an error.

9. The method of claim 7, wherein the completed programming condition is met upon determining the one-time programming has been applied to all portions of the redundancy circuit corresponding to the fail address.

10. The method of claim 6, further comprising verifying each applying another one-time programming to the redundancy circuit, wherein the termination condition further comprises detecting a failure of the verifying.

11. The method of claim 10, further comprising, in response to detecting the failure of the verifying, generating a failed repair report.

12. The method of claim 1, further comprising:
    detecting an access error of the RAM; and
    based at least in part on detecting the access error of the RAM, generating the error information, wherein the error information includes information identifying a target region of the redundancy circuit.

13. The method of claim 1, further comprising:
    detecting an error associated with access of the RAM and, in response, determining whether the error meets a criterion for invoking repair of the RAM; and
    based at least in part on determining that the error meets the criterion for invoking repair of the RAM, generating the error information.

14. The method of claim 13, wherein the criterion for invoking repair of the RAM comprises a multi-bit error.

15. The method of claim 13, wherein the criterion for invoking repair of the RAM comprises a repeated error associated with an address in the RAM.

16. The method of claim 13, further comprising loading at least a portion of the error information into a memory register associated with the RAM.

17. The method of claim 13, further comprising:
    in association with generating the error information, sending a notice of the error from the RAM to a memory controller.

18. The method of claim 17, wherein sending the notice of the error from the RAM to the memory controller is over a back channel between the RAM and the memory controller.

19. The method of claim 1, further comprising, based at least in part on the error information, calculating a number of iterations required to complete the one-time programming, and wherein applying the one-time programming includes:
    repeating, for the number of iterations required to complete the one-time programming, applying another iteration of one-time programming, wherein each repeating programs at least another portion of the redundancy circuit that corresponds to at least another portion of the fail address.

20. The method of claim 1, wherein the one-time programming is a programming of fuses associated with at least a portion of the fail address.

21. The method of claim 1, wherein the RAM is a dynamic access RAM (DRAM).

22. The method of claim 21, wherein the one-time programming is synchronized with the non-refresh interval to follow a respective refresh burst.

23. The method of claim 21, further comprising repeating the applying of the one-time programming to the redundancy circuit, while maintaining the content of the DRAM in the valid state, until a termination condition is met.

24. The method of claim 21, wherein applying the plurality of refresh bursts to the DRAM comprises a succession of refresh bursts, wherein the refresh bursts are spaced apart by the non-refresh intervals, wherein the method further comprises performing, during a succession of the non-refresh intervals, a respective succession of applying the one-time programming to the redundancy circuit.

25. An apparatus for repair of a random access memory (RAM) having a programmable redundancy circuit, comprising:
means for receiving error information, wherein the error information identifies a fail address of the RAM; and
means for applying a one-time programming to the redundancy circuit in response to the error information, and, while applying the one-time programming to the redundancy circuit, maintaining a content of the RAM in a valid state, wherein maintaining the content of the RAM in the valid state comprises applying a plurality of refresh bursts to the RAM, each refresh burst of the plurality of refresh bursts spaced apart by a non-refresh interval that includes the end of a refresh burst and a start of a next refresh burst of the plurality of refresh bursts, wherein the means for applying the one-time programming comprises means for applying the one-time programming between the end of the refresh burst and the start of the next refresh burst, and wherein the one-time programming has a duration that is less than a duration of the non-refresh interval.

26. The apparatus of claim 25, wherein applying the one-time programming to the redundancy circuit in response to the error information comprises applying an iteration of one-time programming that programs at least a portion of the redundancy circuit, and applying another iteration of one-time programming that programs at least another portion of the redundancy circuit.

27. The apparatus of claim 25, wherein the one-time programming comprises an iteration of one-time programming that programs at least a portion of the redundancy circuit that corresponds to at least a portion of the fail address, and wherein, the one-time programming further comprises repeating applying another iteration of the one-time programming to the redundancy circuit until a termination condition is met, wherein each repeating programs at least another portion of the redundancy circuit that corresponds to at least another portion of the fail address, while maintaining the content of the RAM in the valid state.

28. An apparatus for repair of a random access memory (RAM) having a programmable redundancy circuit, comprising:
a module for detecting a fail address in the RAM and generating, as a result, error information, wherein the error information identifies the fail address;
a module for maintaining a content of the RAM in a valid state; and
a module for applying a one-time programming to the redundancy circuit in response to the error information, while the module for maintaining the content of the RAM in the valid state maintains the content of the RAM in the valid state, wherein the module for maintaining the content of the RAM in the valid state is configured to apply a plurality of refresh bursts to the RAM, each refresh burst of the plurality of refresh bursts spaced apart by a non-refresh interval that includes the end of a refresh burst and a start of a next refresh burst of the plurality of refresh bursts, wherein the module for applying the one-time programming is configured to apply the one-time programming between the end of the refresh burst and the start of the next refresh burst, and wherein the one-time programming has a duration that is less than a duration of the non-refresh interval.

29. The apparatus of claim 28, further comprising a module for verifying a success of the one-time programming and, in response to the verifying indicating an error, generate a report.

30. A non-transitory computer-readable medium comprising code, which, when executed by a processor, causes the processor to perform operations for repairing a memory device having a redundancy circuit, while maintaining a valid content in the memory device, the non-transitory computer-readable medium further comprising code for causing the processor to:
receive error information, wherein the error information identifies a fail address of a random access memory (RAM); and
apply a one-time programming to the redundancy circuit in response to the error information, and, while applying the one-time programming to the redundancy circuit, maintain a content of the RAM in a valid state, wherein maintaining the content of the RAM in the valid state comprises applying a plurality of refresh bursts to the RAM, each refresh burst of the plurality of refresh bursts spaced apart by a non-refresh interval that includes the end of a refresh burst and a start of a next refresh burst of the plurality of refresh bursts, wherein the code for causing the processor to apply the one-time programming comprises code to apply the one-time programming between the end of the refresh burst and the start of the next refresh burst, and wherein the one-time programming has a duration that is less than a duration of the non-refresh interval.

* * * * *